(12) United States Patent
Du et al.

(10) Patent No.: US 11,996,134 B2
(45) Date of Patent: May 28, 2024

(54) APPARATUSES, SYSTEMS, AND METHODS FOR DIRECT REFRESH MANAGEMENT SAMPLING PROTECTION

(71) Applicant: MICRON TECHNOLOGY, INC., Boise, ID (US)

(72) Inventors: Bin Du, Shanghai (CN); Liang Li, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 17/695,568

(22) Filed: Mar. 15, 2022

(65) Prior Publication Data

US 2023/0298654 A1    Sep. 21, 2023

(51) Int. Cl.
*G11C 11/406* (2006.01)
*G11C 11/408* (2006.01)
*G11C 11/4096* (2006.01)

(52) U.S. Cl.
CPC .. *G11C 11/40622* (2013.01); *G11C 11/40615* (2013.01); *G11C 11/408* (2013.01); *G11C 11/4096* (2013.01)

(58) Field of Classification Search
CPC . G11C 11/401; G11C 11/406; G11C 11/4023; G11C 11/404; G11C 11/4045; G11C 11/40603; G11C 11/40618; G11C 11/4063; G11C 11/407; G11C 11/4076; G11C 11/4078; G11C 11/408; G11C 11/4087; G11C 11/409; G11C 11/40622; G11C 11/40615; G11C 11/4096
See application file for complete search history.

(56) References Cited

U.S. PATENT DOCUMENTS

| | | | |
|---|---|---|---|
| 2021/0343324 A1* | 11/2021 | Brown | G11C 11/406 |
| 2022/0293162 A1 | 9/2022 | Nale | |
| 2023/0060358 A1* | 3/2023 | Hong | G11C 11/40611 |
| 2023/0141789 A1 | 5/2023 | Cho et al. | |

OTHER PUBLICATIONS

U.S. Appl. No. 17/666,302, titled "Apparatuses, Systems, and Methods for Direct Refresh Management Commands", filed Feb. 7, 2022; pp. all pages of application as filed.

* cited by examiner

*Primary Examiner* — Alfredo Bermudez Lozada
(74) *Attorney, Agent, or Firm* — Dorsey & Whitney LLP

(57) ABSTRACT

Apparatuses, systems, and methods for direct refresh management (DRFM) sampling protection. A memory receives a DRFM address and DRFM sampling command from a controller. The memory also samples addresses into an aggressor register. Responsive to receiving the DRFM address, the memory may prevent addresses which match the DRFM address from being added to the aggressor register for at least a period of time. For example, a protect flag may be activated for the period of time. If the aggressor register already contained an address which matched the DRFM address, it may be removed.

16 Claims, 5 Drawing Sheets

APPARATUSES, SYSTEMS, AND METHODS FOR DIRECT REFRESH MANAGEMENT SAMPLING PROTECTION

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

Different memory cells may lose information at different rates (e.g., different rates of memory decay). The memory may perform CBR operations by refreshing the wordlines in a sequence such that each word line is refreshed faster than the anticipated rate of information decay. Certain situations, such as certain access patterns, may cause an increased rate of data decay. To account for this, the memory and/or a controller of the memory may identify row addresses which should be refreshed out of sequence as part of a targeted refresh operation.

DETAILED DESCRIPTION

Figure 1:
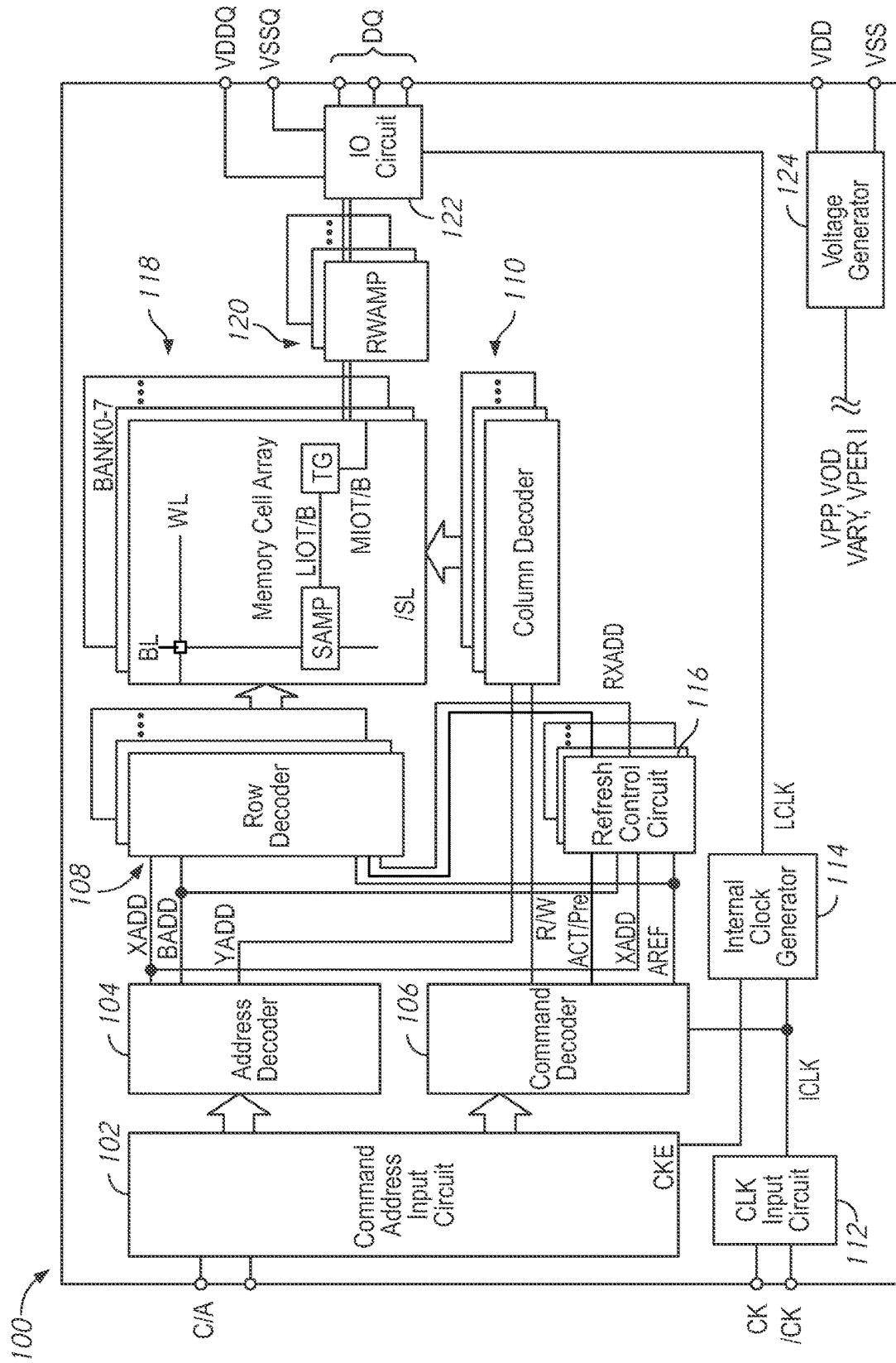
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (wordlines) and columns (bit lines), in each bank of a memory array. The memory cells may be refreshed on a row-by-row basis. In order to prevent information from being lost or corrupted due to this decay, the memory may carry out refresh operations, such as auto-refresh or self-refresh operations, which may perform a sequence of CBR refreshes. During a refresh operation, information may be rewritten to memory cells associated with the wordline to restore their initial states. The CBR operations may be performed on the wordlines of the memory in a sequence such that over a refresh cycle all word lines are refreshed.

The rate at which the refresh operations are performed may be chosen to prevent the loss of information, ideally such that each memory cell is refreshed before the information stored in that memory cell is lost. The rate at which the refresh cycle is performed may be based on an expected fastest rate of information decay. However, certain access patterns to rows of the memory (aggressor rows or aggressor word lines) may cause an increased rate of decay in the memory cells along nearby rows (victim rows or victim word lines). It may thus be important to identify these aggressor rows so that their associated victims may be refreshed as part of a targeted refresh operation outside of the normal CBR sequence.

The memory may include logic which controls the timing of targeted refresh operations. For example, the memory may identify aggressors, store them in an aggressor register, and perform a targeted refresh operation on addresses (e.g., victim addresses) based on one or more addresses in the aggressor register. For example, the memory may perform a targeted refresh operation on addresses based on an address in the aggressor register every N CBR operations. The memory may also perform a targeted refresh operation when commanded to by a controller as part of a refresh management (RFM) command. For example, the memory may receive an RFM command and perform one or more targeted refresh operations based on aggressor addresses in the aggressor register. The memory may also receive a direct RFM (DRFM) command, which both specifies that the memory should perform a targeted refresh operation, and also specifies the aggressor address and the range of victim word lines which should be refreshed as part of the targeted refresh operation. However, if the memory identifies an address as an aggressor and also receives the same address via a DRFM command, then the victims of that address may be over refreshed, and may, in extreme cases become aggressors themselves. It may therefore be useful to prevent addresses received as part of DRFM operations from over-refreshing (of their victims).

The present disclosure is drawn to direct refresh management sampling protection. A memory receives a DRFM address as part of a DRFM operation. For example, the controller may provide an address as well as a DRFM sampling command. The memory may prevent the DRFM address from being refreshed as part of a non-DRFM targeted refresh operation for at least a period of time after the DRFM address was received. For example, the DRFM address may be compared to the addresses already in the aggressor register. If there is not a match (e.g., the DRFM address is not in the aggressor register), then the DRFM address may be prevented from being added to the aggressor register for at least a set period of time. If the DRFM address was already in the aggressor register, then the matching address in the aggressor register may be cleared, and the DRFM address may be prevented from being added again to the aggressor register for at least a set period of time. This may prevent the memory from performing a non-DRFM targeted refresh operation on the DRFM address for at least the set period of time.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. For example, memories may include 4, 16, 32 more or fewer banks. Each memory bank includes a plurality of word lines WL, a plurality of bit lines BL and/BL, and a plurality of memory cells MC arranged at intersections of the plurality of word lines WL and the plurality of bit lines BL and/BL. The selection of the word line WL is performed by a row decoder 108 and the selection of the bit lines BL and/BL is performed by a column decoder 110. In the embodiment of FIG. 1, the row decoder 108 includes a respective row decoder for each memory bank and the column decoder 110 includes a respective column decoder for each memory bank. The bit lines BL and/BL are coupled to a respective sense amplifier (SAMP). Read data from the bit line BL or/BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or/BL.

The semiconductor device 100 may employ a plurality of external terminals that include command and address (C/A) terminals coupled to a command and address bus to receive commands and addresses, and a CS signal, clock terminals to receive clocks CK and/CK, data terminals DQ to provide data, and power supply terminals to receive power supply potentials VDD, VSS, VDDQ, and VSSQ. The external terminals may be coupled to a controller (not shown in FIG. 1) which may operate the memory by providing various signals to the external terminals.

The clock terminals are supplied with external clocks CK and/CK that are provided to an input circuit 112. The external clocks may be complementary. The input circuit 112 generates an internal clock ICLK based on the CK and/CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line. The command decoder 106 also provides activation and pre-charge signals to the different banks of the memory. An activation signal ACT may indicate that a word line in that bank should be activated, while a pre-charge signal Pre may indicate that the word lines should be pre-charged (e.g., closed) in anticipation of a next activation command. In some embodiments, the ACT and Pre signals may share a signal line.

The device 100 may receive commands and addresses as part of an access operation such as a read operation. As part of the access operation, a row address and bank address received along with an activate command. As part of the access operation, a column address and bank address are received along with a read command. Responsive to the read operation, read data is read from memory cells in the memory array 118 corresponding to the row address and column address. The commands associated with the read operation are received by the command decoder 106, which provides internal commands so that read data from the memory array 118 is provided to the read/write amplifiers 120. Responsive to the activate command the row decoder 108 activates a word line associated with the row address. While the row is active, memory cells along that row are coupled to sense amplifiers activated by the column decoder 110 responsive to the read command to read data out along the LIOT/B lines. The read data is output to outside from the data terminals DQ via the input/output circuit 122. The command decoder 106 may then provide a pre-charge command which may 'close' the active row.

The device 100 may receive commands and addresses as part of an access operation such as a write operation. As part of the write operation, a row address and bank address are received along with an activated command and a column address and bank address are received along with write data and a write command. Responsive to the write operation, write data supplied to the data terminals DQ is written to a memory cells in the memory array 118 corresponding to the row address and column address. The commands associated with the write operation are received by the command decoder 106, which provides internal commands so that the write data is received by data receivers in the input/output circuit 122. Responsive to the activate command the row decoder 108 activates a word line associated with the row address. While the row is active, memory cells along that row are coupled to sense amplifiers activated by the column decoder 110 responsive to the write command to receive write data. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC. The command decoder 106 may then provide a pre-charge command which may 'close' the active row.

The device 100 may also perform refresh operations, such as CBR refresh operations. The CBR refresh operations may be performed as part of an auto-refresh operation, where a controller issues an auto-refresh command or as part of a self-refresh operation, where the memory refreshes itself based on internal commands. For example, in some embodiments, the auto-refresh mode command may be externally issued to the memory device 100. In some embodiments, the self-refresh mode command may be periodically generated by a component of the device. Whether responsive to an external command (e.g., auto-refresh) or internal logic (e.g., self-refresh) a refresh signal is used to control timing of refresh operations. For the sake of brevity, a single refresh signal AREF is described herein, however in some embodiments separate signals may be used for auto- and self-refresh.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. In some embodiments, the number of wordlines represented by the refresh address RXADD may vary from one refresh address to another. The refresh control circuit 116 may be controlled to change details of the refreshing address RXADD (e.g., how the refresh address is calculated, the timing of the refresh addresses, the number of wordlines represented by the address), or may operate based on internal logic.

The refresh control circuit 116 may selectively output a targeted refresh address (e.g., which specifies one or more victim address based on an aggressor) or an automatic refresh address (e.g., from a sequence of CBR addresses) as the refresh address RXADD. Based on the type of refresh address RXADD (and in some embodiments, one more additional signals indicating the type of operation), the row decoder 108 may perform a targeted refresh or CBR operation. The automatic refresh addresses may be from a sequence of addresses such that over a cycle of the sequence, all of the word lines are refreshed. For example, a counter circuit may be used to increment or otherwise 'count through' possible row address values for RXADD. The refresh control circuit 116 may cycle through the sequence of CBR addresses at a rate determined by AREF. A refresh cycle may represent the CBR address generator refreshing each row of the memory (e.g., providing each value of the CBR address). In some embodiments, the CBR operations may generally occur with a timing such that the sequence of CBR addresses is cycled such that no information is expected to degrade in the time between CBR operations for a given wordline. In other words, CBR operations may be performed such that each wordline is refreshed at a rate faster than the expected rate of information decay.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. The refresh control circuit 116 may use one or more signals of the device 100 to calculate the targeted refresh address RXADD. For example, the refresh address RXADD may be a calculated based on the row addresses XADD provided along a row address bus by the address decoder 104.

The refresh control circuit 116 includes an aggressor detector circuit which monitors the row addresses XADD provided as part of access operations to determine which rows are aggressors. For example, the refresh control circuit 116 may include an aggressor register, and addresses may be sampled off the address bus. In some embodiments, addresses may be sampled into the aggressor register with random timing. The refresh control circuit 116 uses the identified aggressors to determine the refresh addresses RXADD used in targeted refresh operations. For example, if an address XADD is identified as an aggressor, then the victim addresses issued as RXADD may include XADD+1, XADD−1 (e.g., the physically adjacent word lines), XADD+2, XADD−2, and/or other word lines which are near to the word line associated with XADD.

The refresh control circuit 116 includes internal logic which determines when to perform a targeted refresh operation. For example, each time AREF is received, the refresh control circuit may generate a number of 'refresh pumps' each associated with a refresh operation. For example, after receiving AREF, the refresh control circuit 116 may provide four pumps (e.g., four refresh addresses RXADD). More or fewer pumps per AREF may be used in other examples. In some examples the number of pumps per AREF may vary. The pumps may each specify an CBR or targeted refresh operations. In some embodiments, each pump group (e.g., the set of pumps produced responsive to an AREF) may include a mix of targeted and CBR operations. In some embodiments, each pump group may include refresh operations of one type or the other. In some embodiments, the refresh control circuit 116 may perform a set of targeted refresh operations after performing some number of CBR operations.

The memory device 100 may receive a refresh management RFM command at the C/A terminals. The RFM command may instruct the memory device 100 to perform a targeted refresh command even if one was not otherwise called for. For example the memory 100 may immediately perform a targeted refresh operation, or may perform a targeted refresh operation as a next refresh operation, even if that refresh would otherwise have been a CBR refresh operation. Responsive to the RFM command, the refresh control circuit 116 may select the aggressor word line (e.g., from a queue of identified aggressors) and victims to refresh.

The memory device 100 may receive direct refresh management DRFM commands (e.g., a DRFM sampling command and a DRFM service command) at the C/A terminals. The DRFM commands may instruct the memory device 100 to perform a targeted refresh command, similar to the RFM command, but unlike the RFM command, the DRFM commands also specify an aggressor word line to use to calculate the refresh addresses RXADD, and may also specify other details such as how those refresh addresses should be calculated. For example, as part of an access operation the memory 100 may receive a bank address BADD, row address XADD and activate command at the C/A terminals and then may subsequently receive the DRFM sampling command. Responsive to the DRFM sampling command, the refresh control circuit 116 associated with that bank may store the row address RXADD in a DRFM register of the refresh control circuit 116. Responsive to a DRFM service command, the refresh control circuit 116 may begin issuing refresh addresses RXADD based on the address stored in the DRFM latch.

When the memory 100 receives a DRFM sampling command along with an address (e.g., a DRFM address), the memory 100 may be prevented from performing a non-DRFM targeted refresh operation based on aggressor addresses which match the DRFM address. For example, when a DRFM address is received, a protect flag may be activated, and while active, no address which matches the DRFM address may be loaded into the aggressor register. If an address which matched the DRFM address was already in the aggressor register, it may be removed.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
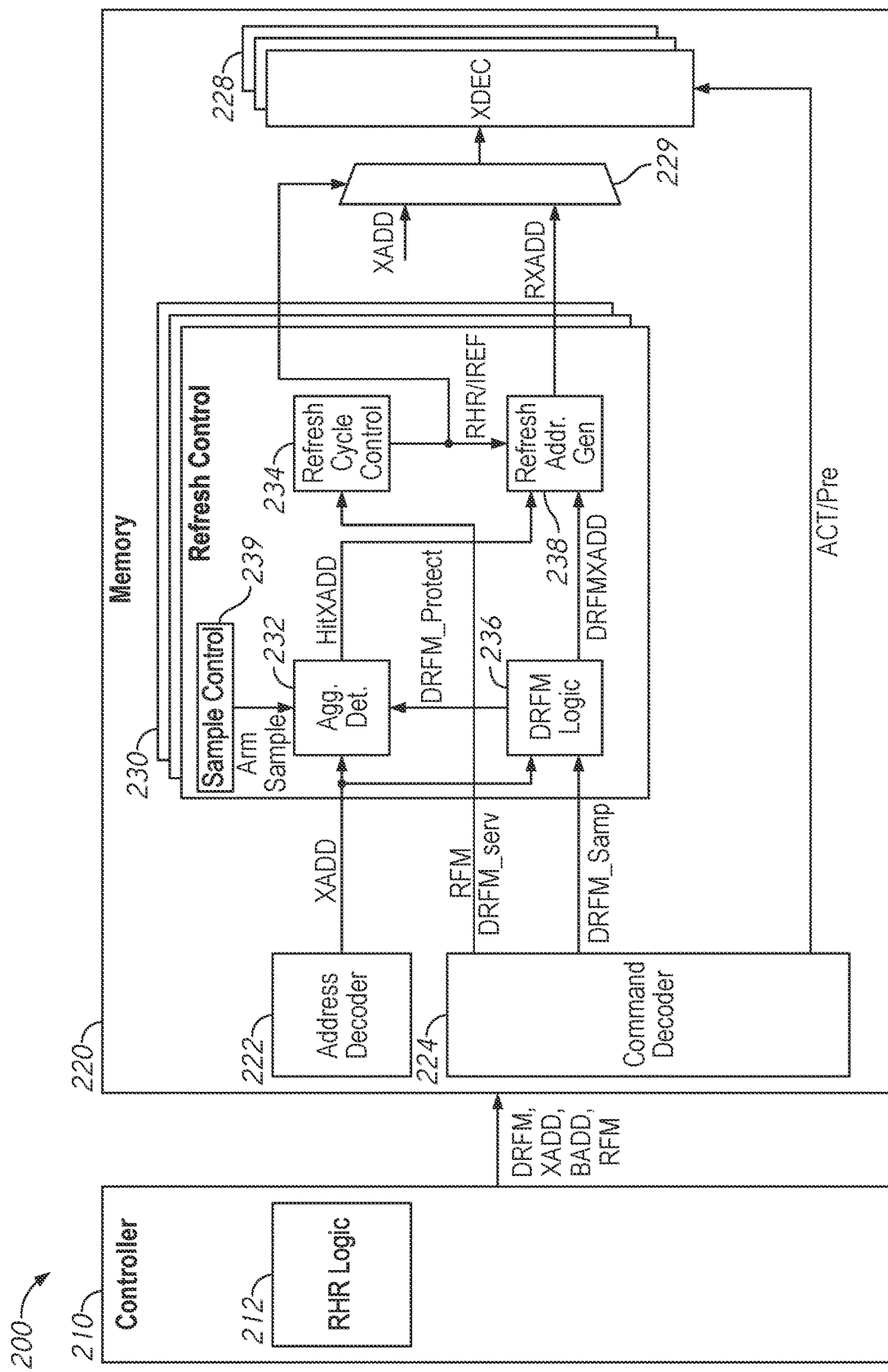
FIG. 2 is a block diagram of a memory system according to some embodiments of the present disclosure.

FIG. 2 is a block diagram of a memory system according to some embodiments of the present disclosure. The system 200 includes a controller 210 and a memory 220. The memory 220 may, in some embodiments, represent the memory device 100 of FIG. 1. The memory 220 shows a simplified view of components relevant to refresh operations. Some components and signals may be omitted for clarity.

The controller 210 is coupled to the memory 220 by various command/address (C/A) signal lines. Row hammer logic 212 of the controller 210 may provide an address XADD and a DRFM command along the C/A lines to the memory 220. The memory 220 includes an address decoder 222 and command decoder 224 which process the addresses and commands respectively. A refresh control circuit 230 of the memory 220 provides a refresh address RXADD as part of a refresh operation. The refresh control circuit 230 includes an aggressor detector 232, which locates and stores aggressor addresses HitXADD based on the access patterns to row addresses XADD. A refresh cycle control circuit 234 determines a type of refresh operation, and generates internal refresh signals which indicate the type of refresh operation. For example, a signal IREF may indicate a CBR refresh operation, while a signal RHR indicates a targeted refresh operation.

A refresh address generator 238 generates the refresh addresses RXADD based on internal logic (e.g., a counter) for a CBR refresh operation, generates the RXADD based on an address HitXADD from the aggressor detector 232 for a (non-DRFM) targeted refresh operation, or generates RXADD based on a DRFM address DRFMXADD from the DRFM logic 236 for a DRFM targeted refresh operation. In some embodiments, since DRFM and non-DRFM targeted refresh operations may chiefly differ in the source of the address used to calculate RXADD, a multiplexer (not shown in FIG. 2) may be used to switch a source of the address between HitXADD and DRFMXADD, but the refresh address generator 238 may respond to them in the same way.

The refresh control 230 includes DRFM logic 236 which stores an address XADD as a DRFM address DRFMXADD based on a DRFM sampling command DRFM_samp provided by the command decoder 224. Once an address has been loaded in the DRFm logic 236, then the Responsive to a DRFM service command DRFM_serv, the refresh cycle control 234 instructs the refresh address generator 238 to generate the addresses RXADD based on DRFMXADD. A multiplexer 229 provides either the original row address XADD (if no refresh operation is called for) or the refresh address RXADD (if the refresh control circuit 234 indicates that a refresh operation is called for) to a row decoder 228. The row decoder 228 then refreshes word lines based on the refresh address(es) RXADD or accesses the row address XADD.

The controller 210 operates the memory 220, for example by providing commands and addresses along CA signal lines to CA terminals of the memory 220. The controller may provide addresses, such as row addresses XADD, along with commands which cause the memory to perform various operations on the memory cells specified by the addresses. For example the controller may be a processor associated with the memory 220.

The controller 210 includes row hammer logic 212 which identifies aggressor addresses and determines if they should be refreshed as part of a DRFM operation or not. For example, the row hammer logic 212 may monitor addresses XADD which are provided to the memory 220. If a given address is provided a certain number of times and/or above a certain frequency, it may be identified as an aggressor. For example, the row hammer logic 212 may count a number of times that addresses are provided and identify the address as an aggressor if the count exceeds a threshold.

If the row hammer logic 212 determines that a DRFM operation is called for, it may provide a DRFM sampling command and a DRFM service command along a C/A bus to the memory 220 along with the identified aggressor address XADD and its bank address BADD. Various sequences of signals and commands may be used to provide the DRFM sampling and service commands to the memory 220. For example, the DRFM sampling command may be provided along with other commands associated with an access operation to the address XADD.

The memory includes an address decoder which receives the address XADD and BADD and provides them to various components such as to refresh control circuit 230 and row decoders 228. There may be a row decoder 228 and refresh control circuit 230 for each bank, and the bank address BADD determines which row decoder 228 and refresh control circuit 230 receives the address XADD. A command decoder 224 receives commands from the controller 210, such as the DRFM commands. The aggressor address XADD and DRFM sampling command may be supplied to the memory 220 along C/A terminals. For example, in some embodiments, one C/A pin may be set aside to indicate if a DRFM sampling command is provided.

Based on the access commands, the command decoder 224 provides internal signals such as an activate command ACT (which may open or activate a word line) and a pre-charge command Pre (which may close or pre-charge the word line). In some embodiments, a single signal line may be used for both signals (e.g., a rising edge may indicate ACT and a falling edge may indicate Pre). The bank address BADD may determine which bank the signals ACT and/or Pre are provided to.

Responsive to the DRFM sampling command DRFM_samp, the DRFM logic 236 may capture (e.g., sample) a current value of the row address XADD. For example, the DRFM logic 236 may include a DRFM latch, and responsive to the signal DRFM_samp, the current value along the row address bus (e.g., XADD) may be loaded into the DRFM latch as the address DRFMXADD. Responsive to the DRFM sampling command, the DRFM logic 236 may provide DRFM protect signals DRFM_protect, which may include a DRFM protect flag at an active level and the current address DRFMXADD. While the DRFM protect flag is active, the aggressor detector 232 is prevented from sampling addresses which match DRFMXADD, and if the aggressor detector already stored an address which matches DRFMXADD, it may be removed. The DRFM logic 236 may keep the DRFM protect flag active for a set period of time. The time for which the DRFM flag is active may be a setting of the memory such as a fuse setting.

The refresh control circuit 230 includes an aggressor detector 232 which detects aggressor addresses based on the addresses XADD along the address bus. The aggressor detector 232 may use similar criteria to the row hammer logic 212, such as a number of accesses and/or a frequency of accesses to a given address. However, the aggressor detector logic 232 may be independent, and may have different criteria. For example, the aggressor detector 232 may use a different threshold for detecting aggressors than the row hammer logic 212.

In an example embodiment, the aggressor detector 232 may sample the address XADD off the row address bus responsive to a sampling signal ArmSample provided by a sample control circuit 239. The sample control circuit 239 may provide the signal ArmSample with random timing, semi-random timing, pseudo-random timing, non-random timing (e.g., periodic timing), timing based on one or more signals (e.g., ACT), timing based on a clock signal, or combinations thereof. Responsive to an activation of the sampling signal ArmSample, a next value of XADD (e.g., the next access operation after ArmSample) may be sampled and loaded into an aggressor register. If the address was already in the aggressor register, a priority flag may be set. Addresses with the priority flag set may be provided as HitXADD before addresses in the aggressor register which do not have the priority flag set. When an address from the aggressor register is used for a targeted refresh operation (e.g., it is used by the refresh address generator 238 to generate addresses RXADD), it may be cleared from the aggressor register and the flags may be reset.

When the DRFM logic 236 provides the DRFM protect flag at the active level, the aggressor detector 232 may compare the address DRFMXADD to the addresses already stored in the aggressor register. If there is a match, the address which matches DRFMXADD may be removed from the aggressor register and its priority flags may be reset. While the protect flag is active, each time a new address is sampled (e.g., each time ArmSample is active) the sampled address may be compared to DRFMXADD, and if there is a match, then the sampled address is not added to the aggressor register.

The refresh control circuit 230 includes a refresh cycle control circuit 234 which determines a timing and type of refresh operation. For example, the refresh cycle control circuit 234 receives a refresh signal AREF, and generates a set of 'pumps' each associated with a refresh operation. The refresh operations may be CBR operations or targeted refresh operations. The refresh cycle control circuit 234 may provide internal signals for each pump to a refresh address generator 238. Based on the type of refresh operation, the refresh address generator 238 provides a refresh address RXADD. For example, if the pump is an CBR operation, then the refresh address RXADD may be generated from a sequence of addresses. For example, the refresh address generator 238 may include a counter which increments a current address generate a next refresh address RXADD in the sequence. When the refresh address RXADD is part of a CBR operation (e.g., an CBR address), the address may be associated with multiple word lines. For example, the address RXADD may be truncated, and all word lines which have an address which shares the non-truncated portion in common may be refreshed by the row decoder 228.

When the refresh cycle controller 234 calls for a targeted refresh operation, the refresh address generator 238 generates the refresh address RXADD based on an identified aggressor HitXADD from the aggressor detector 232. For example, the aggressor detector 232 may include a register of identified aggressors and provide them to the refresh address generator 238. The refresh address generator 238 may generate refresh addresses RXADD for victim word lines associated with the aggressor HitXADD. Each aggressor HitXADD may be used to generate multiple refresh addresses RXADD. For example, refresh addresses RXADD may be generated for HitXADD+1 and HitXADD−1 (e.g., the adjacent word lines). Other numbers of victims and relationships between the victims may be used (e.g., HitXADD+/−1, +/−2, +/−3, etc.).

The refresh cycle control 234 may use various criteria to determine which refresh operations to perform. For example, each time the refresh signal AREF is received, the refresh cycle control circuit 234 may generate four pump signals, each associated with a refresh operation. After a number of CBR operations are performed, a number of targeted refresh operations are called for. Other patterns of CBR and targeted refresh operations may be used in other embodiments. In some embodiments, the refresh cycle control circuit 234 may use various criteria to alter the rate of auto- and targeted refresh operations.

The controller 210 may provide a refresh management signal RFM. Responsive to the RFM signal, the refresh cycle control circuit 234 may provide a set of targeted refresh pumps to the refresh address generator 238, even if refresh operations were not otherwise called for. The RFM command may cause the refresh control circuit 230 to refresh aggressors identified by the aggressor detector 232.

In contrast, responsive to the DRFM command, the refresh control circuit 230 refreshes an address provided by the controller 210. The command decoder 224 generates a DRFM sampling command DRFM_samp which causes the address XADD to be stored in a DRFM logic 236. At some point after providing the DRFM sampling command DRFM_samp, the command decoder 224 also provides a DRFM service command DRFM_serv. Similar to an RFM command, responsive to the DRFM_serv command, the refresh cycle control circuit 234 may provide one or more targeted refresh pumps, even if refresh operations were not otherwise called for. Refresh addresses are generated based on the address DRFMXADD stored in the DRFM logic 236.

In some embodiments, the bank logic may also include fuse logic which determines if the row address XADD has been repaired, and if so redirects the row decoder 228 to access a redundant word line instead of the original word line associated with the row address. In some embodiments, the refresh address generator 238 may take redundancy information into account to ensure that during a targeted refresh operation, the victim addresses 238 are associated with word lines which have a spatial relationship (e.g., physically adjacent, 2 away, 3 away, etc.) from the word line associated with the address XADD.

Figure 3:
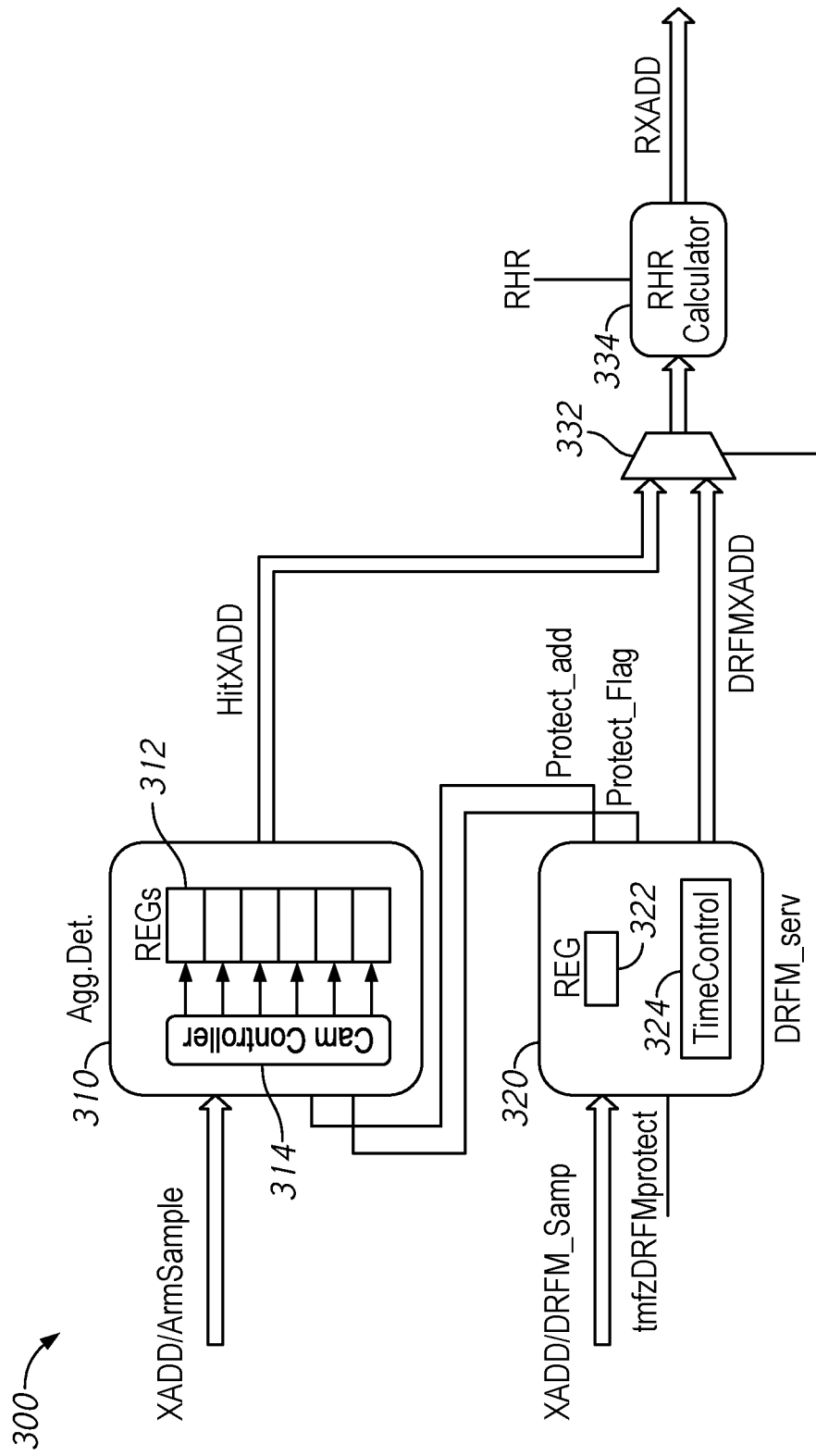
FIG. 3 is a block diagram of a refresh control circuit according to some embodiments of the present disclosure.

FIG. 3 is a block diagram of a refresh control circuit according to some embodiments of the present disclosure. The refresh control circuit 300 may, in some embodiments, may implement a portion of the refresh control circuit 116 of FIGS. 1 and/or 230 of FIG. 2. In particular the refresh control circuit 300 shows components relevant to the DRFM protect flag.

The refresh control circuit 300 includes an aggressor detector circuit 310 (e.g., 232 of FIG. 2) which samples aggressor addresses for non-DRFM targeted refresh operations, and DRFM logic 320 (e.g., 236 of FIG. 2) which receives a DRFM address DRFMXADD identified by a controller. The refresh control circuit 300 also includes a multiplexer 332 and targeted refresh address calculator 334 (e.g., which may be components of refresh address generator 238 of FIG. 2).

The aggressor detector circuit 310 includes an aggressor register 312 and a controller 314 which operates that register. Responsive to a sampling signal ArmSample, the controller 314 compares the address XADD to the addresses already stored in the register 312. If the address is not in the register 312, it may be added to the register 312. In some embodiments, if there is not an open register, than an oldest address in the register 312 may be replaced with the newly sampled address. If the address is already in the register 312, then a priority flag associated with the entry where the address is stored may be set. In some embodiments, there may be multiple priority flags (or a counter or other mechanism for tracking multiple levels) which may be incrementally set each time the address is sampled. One of the stored addresses in the register 312 may be provided as the aggressor address HitXADD. Addresses in the register 312 with a set priority flag may be provided before addresses without a set priority flag.

The DRFM logic 320 includes a DRFM register 322 and a timer control circuit 324. Responsive to a DRFM sampling command DRFM_samp, the address XADD is loaded into the DRFM register 322. When the address is loaded in the register 322 (e.g., responsive to the DRFM sampling command DRFM_samp), the DRFM logic 320 may provide a DRFM protect flag Protect_Flag at an active level, along with an address Protect_add, which is the DRFM address. The address Protect_add may continue to be provided for the period of time (e.g., while the Protect_Flag is active) even after the address DRFMXADD leaves the register 322 (e.g., responsive to a DRFM service command). The DRFM logic 320 provides the protect flag Protect_Flag at an active level for a period of time based on a timer control 324. For example, the timer control 324 may begin counting a number of cycles of a timing signal (e.g., a oscillator signal, a clock signal, etc.) responsive to receiving DRFM_Samp. When the count in the timer control 324 reaches a threshold, the protect flag Protect_Flag is reset to an inactive level. The threshold may be based on a setting tmfzDRFMprotect. In some embodiments, the setting tmfzDRFMprotect may be a fuse setting of the memory.

While the DRFM protect flag Protect_Flag is active, the controller 314 may compare the address Protect_add to any sampled address XADD received by the controller 314. If there is a match, the controller 314 may ignore the sampled address and not add it to the register 312. In addition, when Protect_Flag becomes active, the controller 314 may compare the addresses in the register 312 to the address Protect_add and remove the address from the register which matches Protect_add (and reset any flags associated with that register). In this way, the address Protect_add may be prevented from being provided as HitXADD for at least the time that Protect_Flag is active.

The multiplexer 332 provides either the address HitXADD from the aggressor register 312 if the DRFM service signal DRFM_serv is inactive or the address DRFMXADD from the DRFM register 322 if the signal DRFM_serv is active. The targeted refresh address calculator 334 generates targeted refresh addresses RXADD based on the address it receives from the multiplexer 332.

Figure 4:
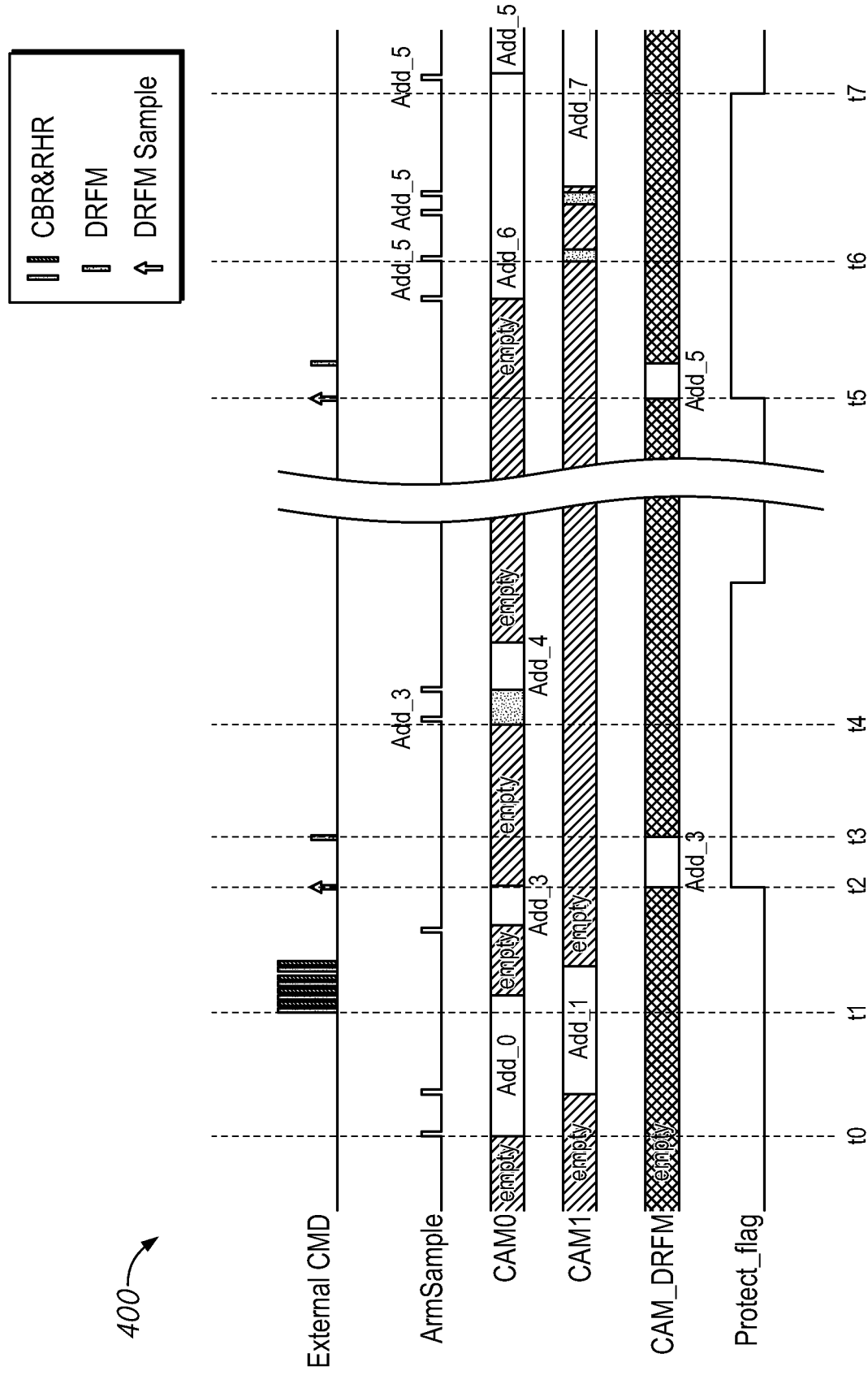
FIG. 4 is a timing diagram of signals related to refresh operations in a memory according to some embodiments of the present disclosure.

FIG. 4 is a timing diagram of signals related to refresh operations in a memory according to some embodiments of the present disclosure. The timing diagram 400 shows various signals which may be used to sample addresses and prevent the DRFM address from being sampled into an aggressor detector (e.g., 232 of FIGS. 2 and/or 310 of FIG. 3). The timing diagram 400 includes a trace for external commands, which includes signals such as refresh commands for targeted refresh and CBR operations RHR and CBR, as well as DRFM sample commands (represented by an upward pointing arrow) and DRFM service command. The timing diagram 400 also includes activations of the signal ArmSample, and representative registers CAM0 and CAM1 of an aggressor register (e.g., 312 of FIG. 3). For the sake of brevity only two aggressor registers are shown. The timing diagram 400 also shows a DRFM register CAM_DRFM (e.g., 322 of FIG. 3) and a protect flag Protect_Flag.

At an initial time t0 both aggressor registers are empty and an activation of the sampling signal ArmSample causes an address Add_0 to be added to the first register CAM0. Similarly, at a second activation of ArmSample after t0 adds an address Add_1 to the second aggressor register CAM1. At a time t1, the memory begins performing refresh operations, which cause the two registers CAM0 and CAM1 to be emptied as their victims are refreshed. Subsequent to this, another activation of ArmSample causes an address Add_3 to be added to CAM1.

At a time t2, a DRFM sampling command DRFM_samp is received, which causes the address Add_3 to be added to the DRFM register CAM_DRFM. Responsive to this, the protect flag Protect_Flag is activated. Responsive to the protect flag being activated, the DRFM address (e.g., Add_3) is compared to the address(es) in the registers CAM0 and CAM1. Since the DRFM address matches the address in CAM0, the register CAM0 is emptied. At a time t3, a DRFM service command DRFM_serv is received, and the CAM_DRFM is emptied since its victims are refreshed. The signal Protect_Flag may remain active and therefore the address Add_3 may still be provided (e.g., as Protect_add of FIG. 3) for comparison even though the DRFM register is empty. At a time t4, the signal ArmSample is activated and the address which would normally be sampled is Add_3. Since the protect flag is still active and the address matches the protect address, the address Add_3 is not added to CAM0 (or CAM1). An activation of ArmSample after t4 causes an address Add_4 to be sampled into CAM0.

At a later time, t5, a DRFM sampling command is received and an address Add_5 is loaded into the CAM_DRFM. The Protect_Flag becomes active again. This time, the two registers CAM0 and CAM1 are empty, so the registers do not need to be cleared. Between a time t5 and t6, an activation of ArmSample causes an address Add_6 to be sampled into CAM0 (since Add_6 does not match Add_5 in the CAM_DRFM). At a time t6, ArmSample activates while the address Add_5 is on the address bus. Accordingly, it is blocked from being added to the registers. However at a time after t6, the address Add_7 is sampled into the register CAM1. At a time t7, the protect flag Protect_Flag becomes inactive (because a set amount of time has passed since t5). At a time after t7, ArmSample activates and the address Add_5 is added to CAM0. The address Add_5 may overwrite the previous address Add_6, since it was the oldest address in the register.

Figure 5:
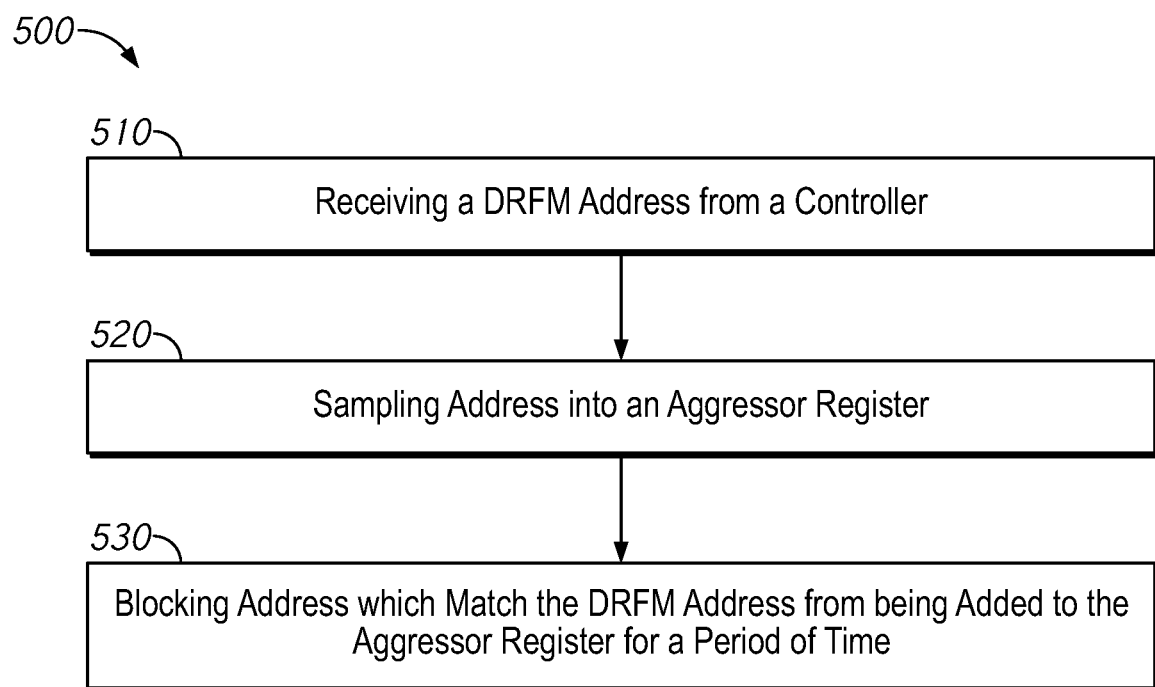
FIG. 5 is a flow chart of a method according to some embodiments of the present disclosure.

FIG. 5 is a flow chart of a method according to some embodiments of the present disclosure. The method 500 may in some embodiments be implemented by one or more of the apparatuses or systems described herein, such as in FIGS. 1-3.

The method 500 includes box 510, which describes receiving a DRFM address from a controller (e.g., 210 of FIG. 2). For example, the memory may receive an address along with a DRFM sampling command (e.g., DRFM_samp). The DRFM and DRFM sampling command may be received at C/A terminals of the memory. The method 500 may include storing the address along the address bus as the DRFM address into a DRFM latch (e.g., 322 of FIG. 3) responsive to the DRFM sampling command. The method 500 may include providing the DRFM address (e.g., as Protect_add) and activating a DRFM protect flag (e.g., Protect_Flag) responsive to receiving the DRFM address (and/or to receiving the DRFM sampling signal).

The method 500 includes box 520, which describes sampling an address into an aggressor register (e.g., 312 of FIG. 3). For example, the method 500 may include activating a sampling signal with random timing, semi-random timing, pseudo-random timing, non-random timing (e.g., periodic timing), timing based on one or more signals (e.g., ACT), timing based on a clock signal, or combinations thereof, and sampling the address on the address bus responsive to the activation of the sampling signal. A controller (e.g., 314) of the aggressor register may compare the sampled address to the stored addresses in the aggressor register. If there is not a match, the sampled address may be added to the register, replacing an existing entry if there is not room. If there is a match, then a priority flag associated with the entry storing that address may be activated.

The method 500 includes box 530, which describes blocking addresses which match the DRFM address from being added to the aggressor register for a period of time. For, example, while the protect flag is active, the controller of the aggressor register may compare any sampled address to the DRFM address (e.g., to Protect_add) and may not add any sampled address which matches the DRFM address to the aggressor register. In some embodiments, method 500 may include comparing the DRFM address to the already stored addresses, and removing any address (and reset its priority flag) which matches the DRFM address.

The method 500 may include keeping the protect flag active for the period of time. For example, a timer control circuit (e.g., 324 of FIG. 3) in the DRFM logic may count the period of time (e.g., by counting a clock signal or other periodic signal). For example the method 500 may include activating the protect flag and deactivating the protect flag after the period of time. The method 500 may include determining the period of time based on a fuse setting of the memory.

The method 500 may include generating a refresh address based on the DRFM address and refreshing one or more word lines based on the refresh address responsive to a DRFM service command. The method 500 may include generating a refresh address based on an address in the aggressor register and refreshing one or more word lines based on the refresh address as part of a (non-DRFM) targeted refresh operation.

While in general the present disclosure refers to determining aggressor and victim wordlines and addresses, it should be understood that as used herein, an aggressor wordline does not necessarily need to cause data degradation in neighboring wordlines, and a victim wordline does not necessarily need to be subject to such degradation. The refresh control circuit may use some criteria to judge whether an address is an aggressor address, which may capture potential aggressor addresses rather than definitively determining which addresses are causing data degradation in nearby victims. For example, the refresh control circuit may determine potential aggressor addresses based on a pattern of accesses to the addresses and this criteria may include some addresses which are not aggressors, and miss some addresses which are. Similarly, victim addresses may be determined based on which wordlines are expected to be effected by aggressors, rather than a definitive determination of which wordlines are undergoing an increased rate of data decay.

As used herein, an activation of a signal may refer to any portion of a signals waveform that a circuit responds to. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level. One of skill in the art should understand that although embodiments may be described with respect to a particular type of activation used by a particular circuit (e.g., active high), other embodiments may use other types of activation (e.g., active low).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
an aggressor register configured to store a plurality of addresses;
direct refresh management (DRFM) logic configured to activate a protect flag responsive to receiving a DRFM address and provide the protect flag at an active level for a period of time based on a timer control configured to count the period of time after the protect flag is activated and deactivate the protect flag when the period of time has elapsed; and
a control circuit configured to add a sampled address to the aggressor register and configured to prevent the sampled address from being added to the aggressor register if the protect flag is active and the sampled address matches the DRFM address.

2. The apparatus of claim 1, wherein the control circuit configured to compare the DRFM address to the stored plurality of addresses and remove a selected one of the stored plurality of addresses which matches the DRFM address when the protect flag becomes active.

3. The apparatus of claim 1, wherein the period of time is determined based on a fuse setting.

4. The apparatus of claim 1, further comprising generating a refresh address based on the DRFM address responsive to a DRFM service command.

5. The apparatus of claim 1, wherein the DRFM logic comprises a DRFM register configured to store the DRFM address responsive to a DRFM sampling signal.

6. The apparatus of claim 5, wherein the DRFM address and DRFM sampling signal are received from a controller.

7. An apparatus comprising:
an aggressor detector circuit configured to sample addresses; and
direct refresh management (DRFM) logic configured to store a DRFM address responsive to a DRFM sampling command, wherein the DRFM logic activates a protect flag for a period of time responsive to receiving the DRFM address,
wherein the aggressor detector is prevented from sampling addresses which match the DRFM address while the protect flag is active, and wherein the DRFM logic includes a timer control circuit configured to count the period of time after the protect flag is activated and deactivate the protect flag when the period of time has elapsed.

8. The apparatus of claim 7, wherein the period of time is based on a fuse setting.

9. The apparatus of claim 7, wherein the aggressor detector circuit comprises an aggressor register configured to store a plurality of stored addresses, and wherein the sampled address is not added to the plurality of stored addresses if it matches the DRFM address while the protect flag is active.

10. The apparatus of claim 9, wherein responsive to the protect flag becoming active the DRFM address is compared to the plurality of stored addresses and if there is a match between the DRFM and one of the plurality of stored addresses, the one of the plurality of stored addresses is removed from the aggressor register.

11. The apparatus of claim 7, further comprising a refresh address generator circuit configured to provide a refresh address based on the DRFM address responsive to a DRFM service command.

12. The apparatus of claim 11, wherein the DRFM service command the DRFM sampling command are received from a controller.

13. A method comprising:
receiving a DRFM address from a controller;
sampling addresses into an aggressor register;
activating a protect flag responsive to receiving the DRFM address and a DRFM sampling command;
blocking addresses which match the DRFM address from being added to the aggressor register while the protect flag is activated;
counting a period of time after the protect flag was activated; and
deactivating the protect flag the period of time after activating the protect flag.

14. The method of claim 13, further comprising removing a stored address which matches the DRFM address from the aggressor register.

15. The method of claim 13, further comprising refreshing at least one word line in a memory array based on the DRFM responsive to a DRFM service command.

16. The method of claim 15, further comprising refreshing at least one word line in the memory array based on an address from the aggressor register as part of a targeted refresh operation.

* * * * *